United States Patent
Kim et al.

(10) Patent No.: US 12,356,572 B2
(45) Date of Patent: Jul. 8, 2025

(54) CUSHION PLATE, DISPLAY DEVICE INCLUDING THE SAME, AND DISPLAY APPARATUS INCLUDING THE SAME

(71) Applicant: LG DISPLAY CO., LTD., Seoul (KR)

(72) Inventors: Kyoung-Hoon Kim, Gumi-si (KR); Wangeon Sim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 286 days.

(21) Appl. No.: 17/885,030

(22) Filed: Aug. 10, 2022

(65) Prior Publication Data
US 2023/0105863 A1    Apr. 6, 2023

(30) Foreign Application Priority Data

Oct. 6, 2021    (KR) .................. 10-2021-0132282

(51) Int. Cl.
*G06F 1/20*     (2006.01)
*H05K 5/00*     (2006.01)
*H05K 5/03*     (2006.01)
*H05K 7/20*     (2006.01)

(52) U.S. Cl.
CPC ............. *H05K 5/03* (2013.01); *H05K 5/0018* (2022.08); *H05K 7/20963* (2013.01)

(58) Field of Classification Search
None
See application file for complete search history.

(56) References Cited

U.S. PATENT DOCUMENTS

| | | | |
|---|---|---|---|
| 11,058,018 B1* | 7/2021 | Yoon | G06F 1/1643 |
| 11,650,640 B2 | 5/2023 | Won et al. | |
| 11,917,857 B2 | 2/2024 | Li et al. | |
| 2024/0292572 A1* | 8/2024 | Yang | H05K 7/20509 |

FOREIGN PATENT DOCUMENTS

| | | |
|---|---|---|
| CN | 106887186 A | 6/2017 |
| CN | 107275378 A | 10/2017 |
| CN | 207560083 U | 6/2018 |
| CN | 108447886 A | 8/2018 |
| CN | 110047379 A | 7/2019 |
| CN | 111443762 A | 7/2020 |
| CN | 112909069 A | 6/2021 |

(Continued)

OTHER PUBLICATIONS

Chinese Office Action dated Aug. 19, 2024 issued in Patent Application No. 202210716044.9 (15 pages).

(Continued)

*Primary Examiner* — Xanthia C Relford
*Assistant Examiner* — Xanthia C Cunningham
(74) *Attorney, Agent, or Firm* — Fish & Richardson P.C.

(57) ABSTRACT

A display device includes a cover member; a display panel disposed on the cover member; and a cushion plate disposed on the display panel, wherein the cushion plate includes a cushion layer and a heat-dissipation layer, wherein the heat-dissipation layer includes: a first body vertically overlapping with the cushion layer; and at least one first extension extending from the first body and outwardly of the cushion layer so as not to vertically overlap with the cushion layer, wherein the first extension is disposed on the cover member so as not to vertically overlap with the display panel.

23 Claims, 15 Drawing Sheets

(56) References Cited

FOREIGN PATENT DOCUMENTS

| | | |
|---|---|---|
| CN | 113112927 A | 7/2021 |
| CN | 113362723 A | 9/2021 |
| KR | 10-2016-0059839 A | 5/2016 |
| KR | 20190115159 A | 10/2019 |
| KR | 20200060639 A | 6/2020 |
| KR | 20200124483 A | 11/2020 |
| KR | 10-2021-0081953 A | 7/2021 |
| KR | 10-2021-0086029 A | 7/2021 |

OTHER PUBLICATIONS

Korean Office Action dated Aug. 23, 2024 issued in Patent Application No. 10-2021-0132282 (17 pages).
Office Action in Chinese Appln. No. 202210716044.9, mailed on Mar. 5, 2025, 33 pages (with English translation).
Office Action in Korean Appln. No. 10-2021-0132282, mailed on May 28, 2025, 5 pages (with English translation).

\* cited by examiner

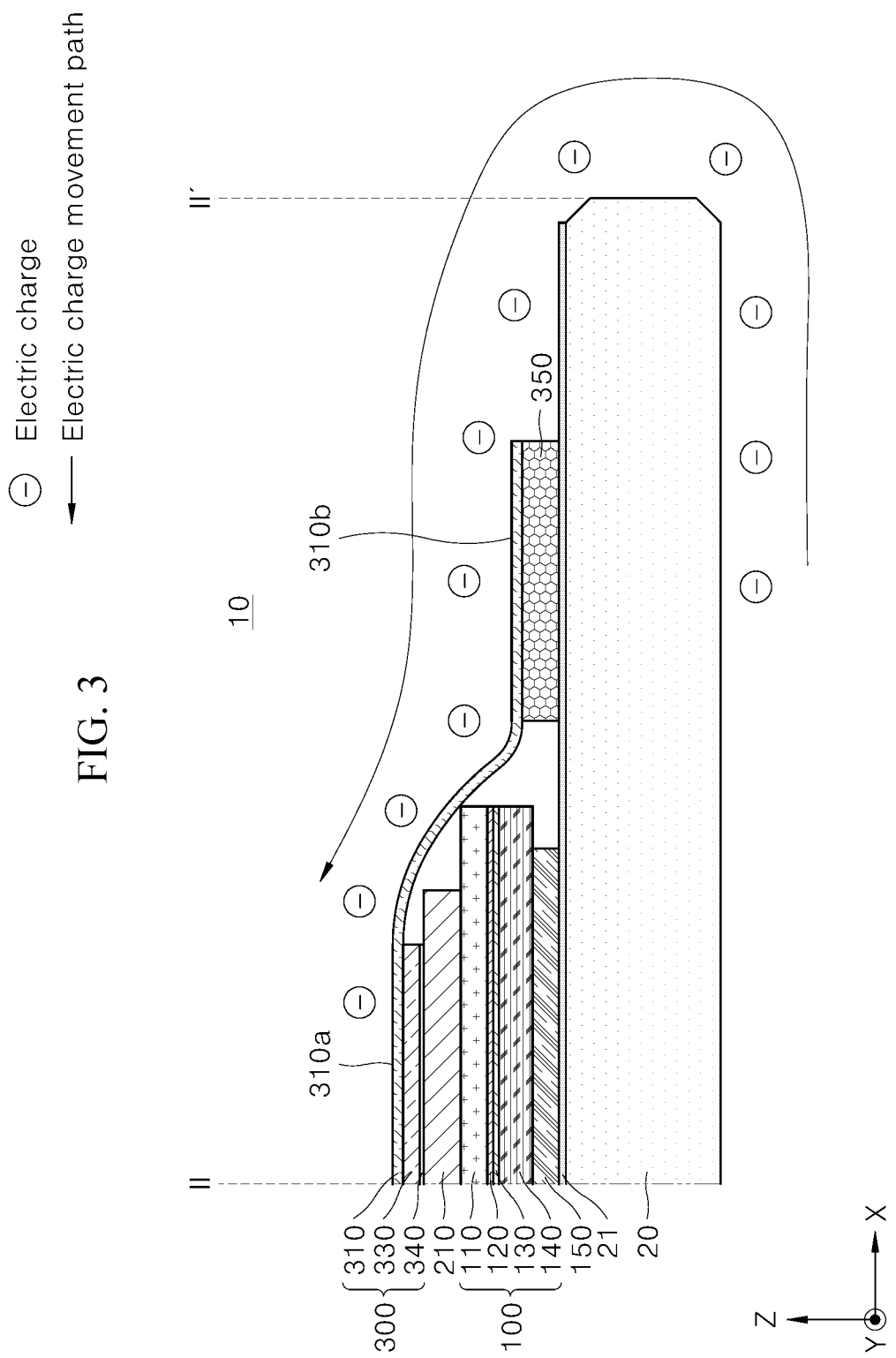

CUSHION PLATE, DISPLAY DEVICE INCLUDING THE SAME, AND DISPLAY APPARATUS INCLUDING THE SAME

CROSS-REFERENCE TO RELATED APPLICATION

This application claims the priority of Korean Patent Application No. 10-2021-0132282 filed on Oct. 6, 2021, which is hereby incorporated by reference in its entirety.

BACKGROUND

Field of the Disclosure

The present disclosure relates to a cushion plate, a display device including the same and a display apparatus including the same, and more particularly, to a cushion plate capable of constituting a new charge movement path and thus reducing occurrence of a brighter phenomenon and a greenish phenomenon at a distal end of a display panel, a display device including the same and a display apparatus including the same.

Description of the Background

Display apparatuses are implemented in a variety of forms, such as televisions, monitors, smart phones, tablet PCs, laptops, and wearable devices.

In general, a display apparatus includes a display area for displaying a screen and a non-display area formed along an outer edge of the display area.

In the display apparatus, the non-display area is also referred to as a bezel area. When the bezel area is thick, the user's gaze is dispersed. When the bezel area is thin, the user's gaze may be fixed on the screen of the display area and thus immersion may be increased.

In other words, when the bezel area becomes thinner, an overall size of the display apparatus may be reduced while increasing the user's immersion. Thus, demand from consumers for a display apparatus having the reduced bezel area as much as possible is increasing.

Electric charges may be generated on a surface of a display apparatus due to physical friction or the like.

When the electric charges generated in this way are not discharged to an outside through a ground path, the electric charges may be intensively accumulated on a side surface of a distal end of a display panel located in a bezel area of the display panel.

When the electric charges are accumulated in a specific area, an electric field may be generated in proportion to an amount of the accumulated electric charges.

Therefore, when the electric charges generated on the surface of the display apparatus are not effectively discharged to the outside, a strong electric field may be generated on the side surface of the distal end of the display panel.

When the strong electric field is generated on the side surface of the distal end of the display panel, a brighter phenomenon in which a side area of the distal end becomes brighter compared to a display area of the display panel and a greenish phenomenon in which a partial area becomes green may occur.

When the brighter phenomenon and the greenish phenomenon occur at the distal end of the display panel, this may lead to a quality defect of the display panel.

In one example, a charging solution may be applied to form a charge movement path to discharge the electric charges of the display apparatus to the outside.

However, since the charging solution is in a liquid state, it is difficult to achieve a uniform application length and width such that there is difficulty in process management. A resistance fluctuation range based on an application amount of the charging solution may be very large.

Further, since a separate process of applying the charging solution is required for forming the charge movement path, efficiency of a manufacturing process of the display apparatus may be reduced.

In addition, the charging solution is applied so as to be exposed out of the display device. Thus, the charging solution may be damaged in a handling process during the manufacturing process, or may be easily damaged by external impacts such as thermal impact, resulting in loss of a charging function.

In addition, it may be difficult to apply a small amount of the charging solution. Thus, when a shape of each of set parts coupled to the display device becomes complicated and thus a space of the set part which avoids receiving the charging solution increases. Thus, it may be difficult to match the set part having the complicated shape with the charging solution.

SUMMARY

Accordingly, the present disclosure is to provide a cushion plate that may constitute a new charge movement path and thus reduce occurrence of the brighter phenomenon and the greenish phenomenon at the distal end of the display panel, and a display device including the same, and a display apparatus including the same.

The present disclosure is also to provide a cushion plate that may constitute a new charge movement path, and a display device including the same, and a display apparatus including the same.

The present disclosure is also to provide a cushion plate that may reduce occurrence of a brighter phenomenon and a greenish phenomenon at a distal end of a display panel, and a display device including the same, and display apparatus including the same.

The present disclosure is also to provide a cushion plate that may reduce an overall thickness of a display apparatus, and a display device including the same, and a display apparatus including the same.

The present disclosure is also to provide a cushion plate that may increase efficiency of a process for forming the charge movement path, and a display device including the same, and a display apparatus including the same.

The present disclosure is also to provide a cushion plate that may reduce the loss of the charging function resulting from damage to the charge movement path by an external factor such as physical contact or impact, and a display device including the same, and a display apparatus including the same.

Further, the present disclosure is to provide a cushion plate that may enable stable resistance management and may stably constitute a charge movement path having the smallest width, and a display device including the same, and a display apparatus including the same.

The present disclosure is not limited to the above-mentioned. Other features and advantages of the present disclosure that are not mentioned may be understood based on following descriptions, and may be more clearly understood based on aspects of the present disclosure. Further, it will be easily understood that the purposes and advantages of the present disclosure may be realized using means shown in the claims and combinations thereof.

A display device in accordance one aspect of the present disclosure includes a cover member; a display panel disposed on one surface of the cover member; and a cushion plate disposed on one surface of the display panel, wherein the cushion plate includes a cushion layer and a heat-dissipation layer, wherein the heat-dissipation layer includes: a first body vertically overlapping the cushion layer; and at least one first extension extending from the first body and outwardly of the cushion layer so as not to vertically overlap the cushion layer, wherein the first extension is disposed on one surface of the cover member so as not to vertically overlap with the display panel.

A display apparatus in accordance one aspect of the present disclosure includes a cover member; a display panel disposed on one surface of the cover member; a cushion plate disposed on one surface of the display panel, wherein the cushion plate includes a cushion layer, and a heat-dissipation layer, wherein the heat-dissipation layer includes a first body and a first extension extending from the first body and outwardly of the cushion layer so as not to vertically overlap the cushion layer; a conductive adhesive layer disposed between the first extension and the cover member, wherein the conductive adhesive layer includes a second body and a second extension extending from the second body and outwardly of the first extension so as not to vertically overlap the first extension; and a middle frame disposed on one surface of the cushion plate and electrically connected to the conductive adhesive layer.

A cushion plate in accordance one aspect of the present disclosure includes a cushion layer; a heat-dissipation layer, wherein the heat-dissipation layer includes a first body disposed on a top surface of the cushion layer, and a first extension extending from the first body and outwardly of the cushion layer so as not to vertically overlap the cushion layer; and a conductive adhesive layer disposed on a bottom surface of the first extension.

According to an aspect of the present disclosure, the cushion plate includes the heat-dissipation layer having the first extension extending outwardly of the cushion layer so as not to vertically overlap the cushion layer. The first extension is disposed on one surface of the cover member. Thus, a new charge movement path through which the electric charges of the cover member may move directly to the cushion plate may be formed.

Further, the conductive adhesive layer disposed between the first extension of the heat-dissipation layer and the cover member and including the second extension is electrically connected to the middle frame. Thus, the heat-dissipation layer of the cushion plate and the middle frame may be electrically connected to each other via the conductive adhesive layer.

Therefore, a new charge movement path through which the electric charges of the display device and the cover member may move to the cushion plate and the middle frame may be formed.

Accordingly, the concentration of the electric charges on the side surface of the display panel may be reduced, thereby reducing the brighter phenomenon and the greenish phenomenon that may be otherwise intensively generated in the partial area of the side surface of the display panel.

Further, the heat-dissipation layer of the cushion plate and the middle frame may be electrically connected to each other via the conductive adhesive layer. Thus, there is no need to provide a separate set adhesive tape for forming a charge movement path between the cushion plate and the middle frame, such that the overall thickness of the display apparatus may be reduced as the thickness of the set adhesive tape is reduced.

Further, because the heat-dissipation layer extends outwardly and then is disposed on the cover member so that the cushion plate and the cover member are directly connected to each other so as to constitute the charge movement path, a separate additional process for forming the charge movement path after forming the cushion plate is not required, so that the efficiency of the manufacturing process may be improved.

Further, as the conductive adhesive layer is disposed between the first extension of the heat-dissipation layer and the cover member, the electric charges of the cover member may move to the back surface of the display device through the charge movement path connected to the heat-dissipation layer of the cushion plate via the conductive adhesive layer.

Since the cushion plate is electrically connected to the ground electrode, the electric charges moved to the back surface of the display device may be discharged to the outside through the ground electrode.

As the conductive adhesive layer is disposed between the first extension of the heat-dissipation layer and the cover member, adhesion between the cover member and the first extension may be improved, and thus, the occurrence of the lifting phenomenon may be reduced.

Further, the conductive adhesive layer is formed between the heat-dissipation layer of the cushion plate and the cover member so as to constitute the charge movement path. Thus, the conductive adhesive layer may not be exposed to the outside, thereby reducing the loss of the charging function resulting from the damage to the charge movement path due to the external factors such as physical contact or impact.

Further, the conductive adhesive layer is formed between the heat-dissipation layer of the cushion plate and the cover member so as to constitute the charge movement path. Thus, stable resistance management may be achieved, and the charge movement path with the smallest width may be stably formed, compared to a case in which the charge movement path is formed using the charging solution.

Effects of the present disclosure are not limited to the above-mentioned effects, and other effects as not mentioned will be clearly understood by those skilled in the art from following descriptions.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 3 is a cross-sectional view in II-IF direction of the display device according to an aspect of the present disclosure;

DETAILED DESCRIPTION

Figure 1A:
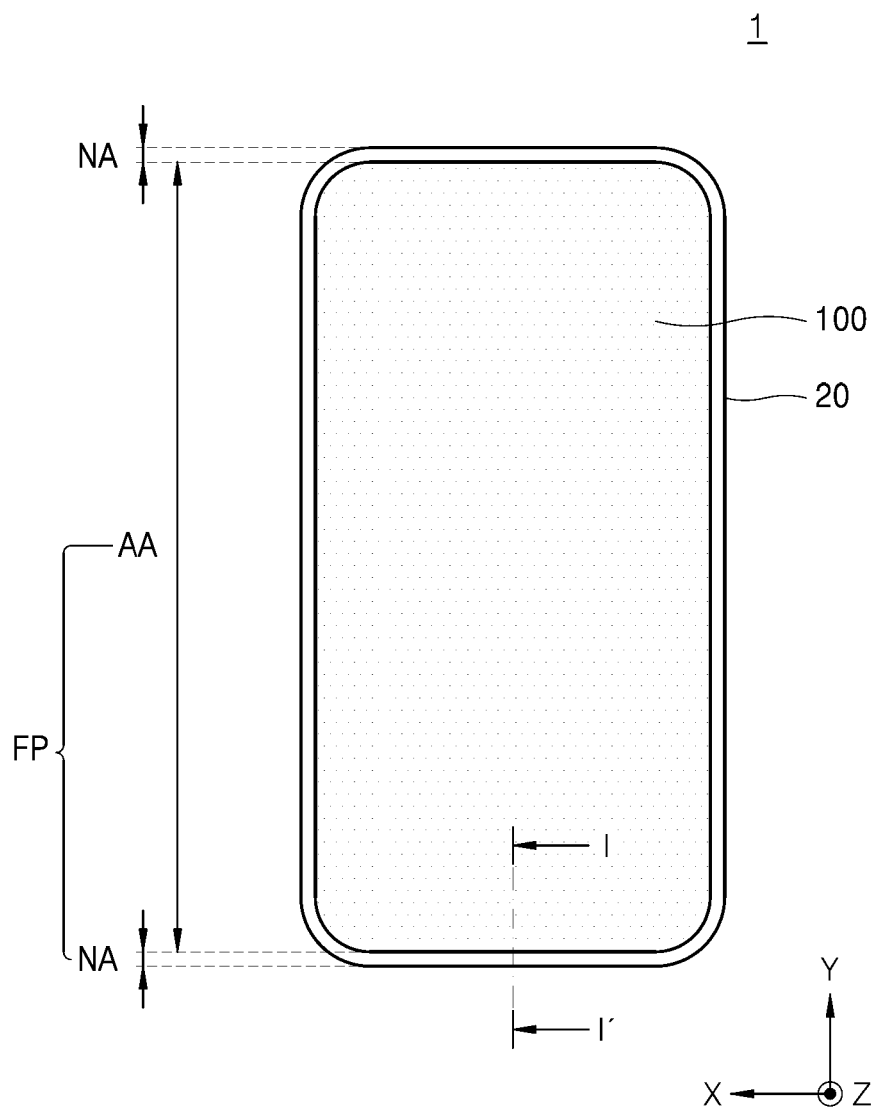
FIG. 1A and FIG. 1C respectively illustrate a front surface and a back surface of a display apparatus according to an aspect of the present disclosure, and FIG. 1B illustrate a back surface of a display device in a state in which a casing is removed.

Advantages and features of the present disclosure, and a method of achieving the advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various aspects of the present disclosure may be partially or entirely combined with each other, and may be technically associated with each other or operate with each other. The aspects may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The display apparatus according to the present disclosure may be applied to an organic light-emitting display apparatus. The disclosure is not limited thereto. The display apparatus according to the present disclosure may be applied to various display apparatuses such as a micro LED display apparatus or a quantum dot display apparatus.

Hereinafter, a display apparatus according to an aspect of the present disclosure will be described in detail with reference to the drawings.

Figure 1B:
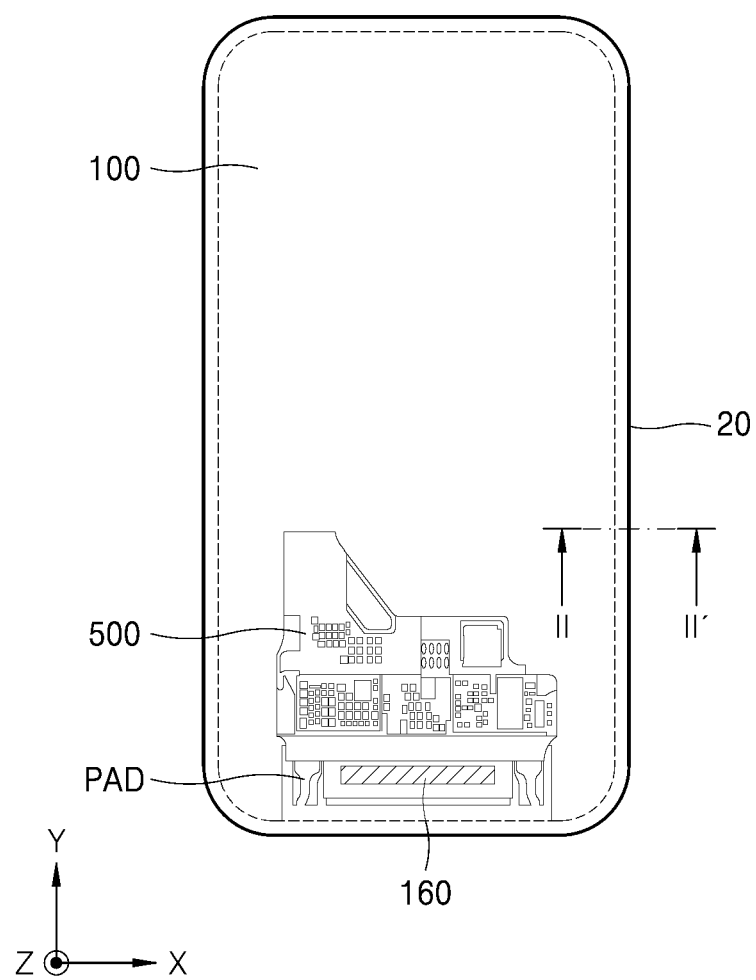
Figure 1C:
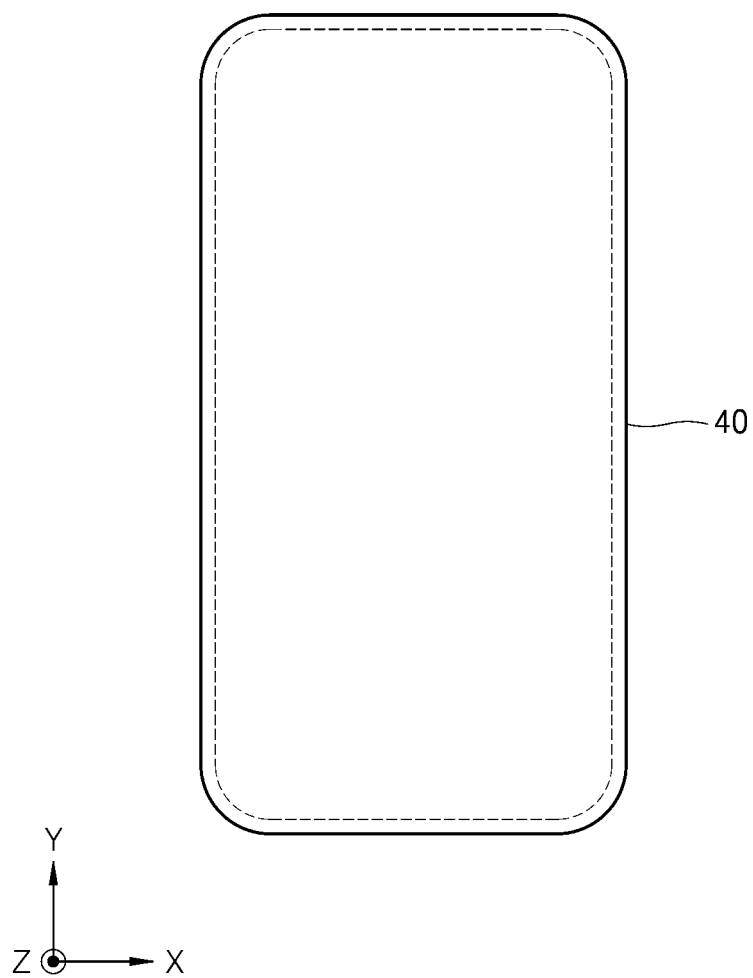

FIG. 1A and FIG. 1C respectively show front and back surfaces of the display apparatus according to an aspect of the present disclosure, and FIG. 1B shows the back surface of the display apparatus in a state in which a casing is removed.

As used herein, each of frontward and upward directions may mean a Z-axis direction, and each of backward and downward directions may mean a −Z-axis direction.

A display apparatus 1 may include a display device 10 including a cover member 20 and a display panel 100 attached to a bottom of the cover member 20. A direction from a top to the bottom of the cover member may refer to the downward direction (−Z axis direction).

The cover member 20 may be disposed to constitute the front portion of the display apparatus 1 to protect the display apparatus 1 from external impact.

An edge portion of the cover member 20 may have a curved portion or a bent portion that is curved or bent toward the back surface of the display device 10.

Since the cover member 20 may be disposed to cover a side surface of the display device 10 of the display apparatus 1, the member 20 may protect the display panel 100 from external impact not only on the front surface of the display device 10 but also on a side surface thereof.

The cover member 20 may vertically overlap the display area AA of the display panel that displays an image. For example, the cover member 20 may be made of a transparent plastic material that may transmit an image therethrough, or may be made of a cover glass of a transparent glass material. The present disclosure is not limited thereto.

A casing 40 for supporting the cover member 20 may be disposed on the back surface of the display device 10.

The casing 40 may serve as a housing that protects the rear surface of the display apparatus 1, and may function as a casing constituting the outermost shell of the display apparatus 1.

The casing 40 may be made of various materials such as plastic, metal, or glass.

A middle frame (not shown) may be additionally disposed between the cover member 20 and the casing 40.

The middle frame may be disposed on a back surface of the display device 10 and may accommodate therein the display device 10. The middle frame may contact the cover member 20 such that the middle frame supports the cover member 20.

The middle frame may serve as a housing that protects the rear surface of the display device 10.

The middle frame may have a structure in which the display device 1 is disposed on one surface of the display device 10, and additional components such as a battery to apply power to the display apparatus 1 is disposed on the other surface of the middle frame.

A front portion FP of the display panel 100 may be disposed on a bottom surface of the cover member 20.

The front portion FP may include a pixel array including a plurality of pixels having a plurality of light-emitting elements, and driving transistors, and signal lines transmitting a drive signal to the pixels, so that an image may be displayed from the front portion.

The front portion FP may include a display area AA (active area) where the image is displayed and a non-display area NA (non-active area) other than the display area AA. The non-display area NA may be formed as an edge area surrounding the display area AA.

The display area AA and the non-display area NA may be equally applied to the cover member 20.

An area of the cover member 20 through which the image transmits may be the display area AA thereof.

An area of the cover member 20 which surrounds the display area AA and through which the image does not transmit may be a non-display area NA thereof.

The non-display area NA may be defined as a bezel area.

The display panel 100 disposed under the cover member 20 may include a bent portion which extends from one side of the front portion FP thereof and is bent downwardly.

The bent portion may be located at the outermost part of the display panel 100, and thus may be easily exposed to external impact. The bent portion may be easily deformed or broken when the impact is applied thereto. Accordingly, a support member or a reinforcing member for protecting the bent portion may be added to absorb the impact.

Hereinafter, a structure of the display device 10 according to an aspect of the present disclosure will be described.

Figure 2:
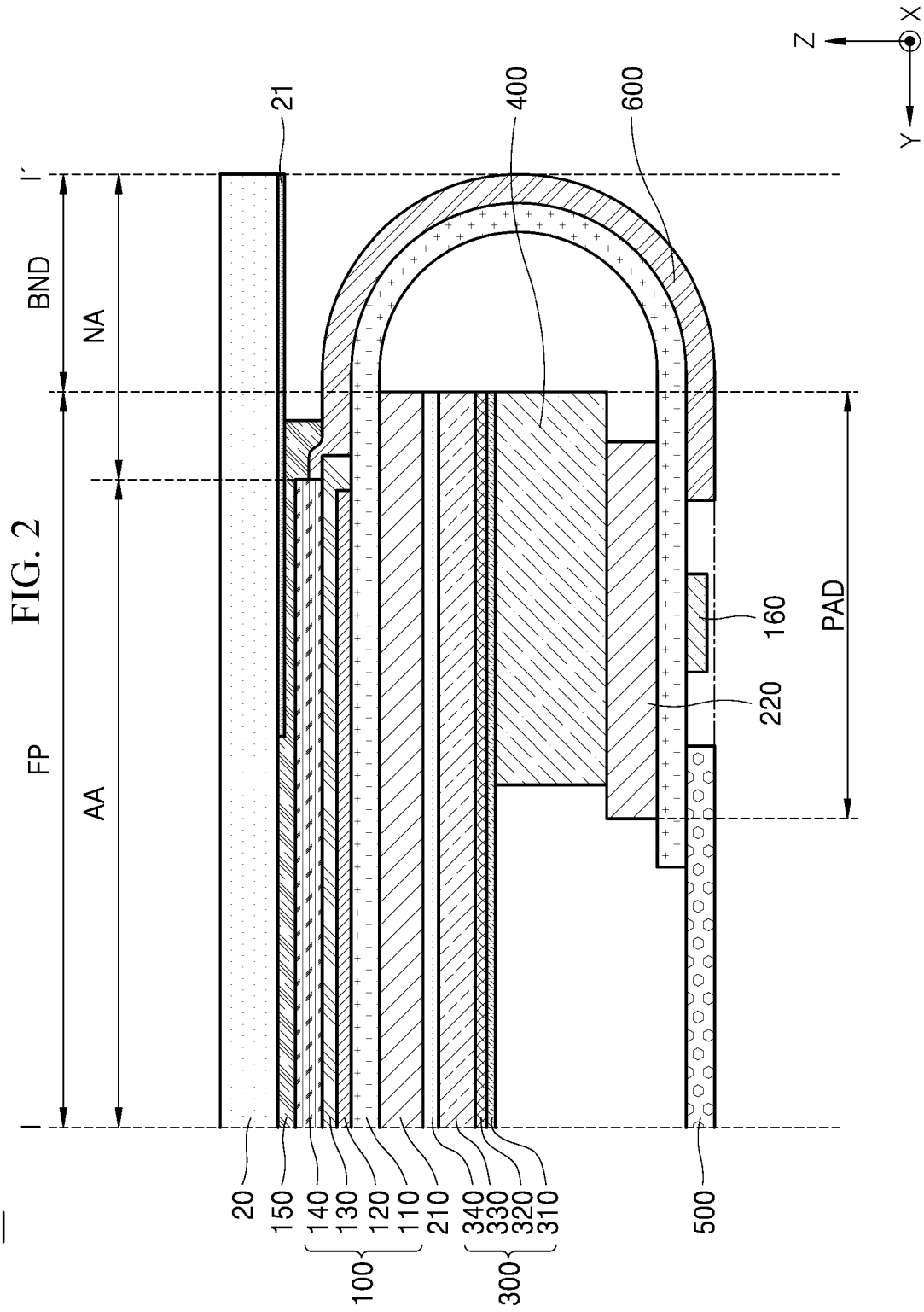
FIG. 2 is a cross-sectional view in I-I' direction of the display device according to an aspect of the present disclosure.

FIG. 2 is a cross-sectional view taken along line I-I' of the display device 10 according to an aspect of the present disclosure.

The display device 10 may include the cover member 20 as the topmost portion thereof and the display panel 100 disposed under the cover member 20.

The display device 10 may include the display panel 100 having the front portion FP, a bent portion BND, and a pad portion PAD bent from the bent portion BND so as to be disposed on a back surface of the front portion FP, a cushion plate 300 disposed between the front portion FP and the pad portion PAD, and disposed below the front portion FP, and a second connection member 400 to fix the pad portion PAD to the cushion plate 300.

A first back plate 210, the cushion plate 300, the second connection member 400, a second back plate 220, and the pad portion PAD may be sequentially disposed under the front portion FP of the display panel 100.

A first connection member 150 may be disposed between the cover member 20 and the display panel 100.

The first connection member 150 may connect or combine the cover member 20 and the display panel 100 to each other.

For example, the first connection member 150 may be a fixing member. The present disclosure is not limited to the term.

Since the first connection member 150 may be disposed to vertically overlap with the display area AA, the member 150 may be made of a material through which the image of the display panel 100 may transmit.

For example, the first connection member 150 may be made of or may include a material such as OCA (Optical Clear Adhesive), OCR (Optical Clear Resin), and PSA (Pressure Sensitive Adhesive). However, the present disclosure is not limited thereto.

A light blocking layer 21 may be disposed in an edge area including a non-display area NA of a bottom surface of the cover member 20.

The light blocking layer 21 may prevent various circuits and lines disposed in the non-display area NA of the display panel 100 and various structures that may be disposed in the non-display area NA of the display panel 100 from being viewed to a user.

The light blocking layer 21 may be disposed in a corresponding manner to at least the non-display area NA of the display panel 120. The light blocking layer 21 may be made of a material capable of absorbing light. For example, the light blocking layer 21 may be made of a black matrix and may be formed by printing black ink. The present disclosure is not limited thereto.

The light blocking layer 21 may include a conductive material and be conductive. When the light blocking layer 21 is conductive, the light blocking layer 21 may perform electrical connection. To this reason, the light blocking layer 21 may constitute a charge movement path to move the electric charges of the cover member 20.

The display panel 100 disposed under the cover member 20 may include the front portion FP, the bent portion BND, and the pad portion PAD which constitute a display substrate 110.

The front portion FP of the display panel 100 may be disposed under the first connection member 150. For example, the front portion FP may be a portion where the image is displayed. The front portion may include the display substrate 110, a pixel array 120, an encapsulation portion 130, and a polarizing plate 140.

The bent portion BND of the display panel 100 may extend from one side of the front portion FP and be bent downwardly (in the −Z-axis direction) and then horizontally (in a Y-axis direction). The bent portion BND may include the display substrate 110 and the signal line.

The pad portion PAD of the display panel 100 may extend from the bent portion BND and be disposed under the front portion FP.

The pad portion PAD may include the display substrate 110, the signal line, and a pad electrode connected to the signal line. A driver circuit 160 or a flexible circuit board 500 for driving a pixel may be mounted on the pad electrode.

The polarizing plate 140 may be disposed on the top surface of the front portion FP and thus may be disposed on the top surface of the display panel 100. In addition, a functional layer for improving display performance of the display apparatus may be further disposed between the first connection member 150 and the polarizing plate 140.

The polarizing plate 140 prevents reflection of external light and improves the outdoor visibility and contrast ratio of the image displayed on the display panel 100.

The display panel 100 may include the display substrate 110, the pixel array 120 disposed on the display substrate 110, and the encapsulation portion 130 disposed to cover the pixel array 120.

A portion of the display substrate 110 may constitute a bottom of the display panel 100.

The display substrate 110 may constitute each of the front portion FP, the bent portion BND, and the pad portion PAD.

The display substrate 110 may be made of a flexible plastic material and may have flexible properties.

The display substrate 110 may include polyimide, or may be made of a thin glass material having flexibility.

The pixel array 120 may be disposed on the display substrate 110. The pixel array 120 may display an image. An area where the pixel array 120 may be disposed may be the display area AA.

Accordingly, an area of the cover member 20 corresponding to the pixel array 120 may be a display area AA of the cover member 20, while an area of the cover member 20 other than the display area AA may be a non-display area NA of the cover member 20.

The pixel array 120 may include light-emitting elements, thin-film transistors for driving the light-emitting elements, and the signal lines such as a gate line, a data line, and a pixel driving power line on the display substrate 110.

The pixel array 120 may include pixels that display images based on signals supplied to the signal lines. The pixel may include the light-emitting element and the thin-film transistor.

The light-emitting element may include an anode electrode electrically connected to the thin-film transistor, a light-emitting layer formed on the anode electrode, and a cathode electrode for supplying a common voltage.

The thin-film transistor may include a gate electrode, a semiconductor layer, a source electrode, and a drain electrode. The semiconductor layer of the thin-film transistor may include silicon such as a-Si, poly-Si, or low-temperature poly-Si, or oxide such as IGZO (Indium-Gallium-Zinc-Oxide). The present disclosure is not limited thereto.

The anode electrode may be disposed in each pixel area and in a manner corresponding to an opening area defined according to a pattern shape of the pixel and may be electrically connected to the thin-film transistor.

The light-emitting element may include a light-emitting layer formed between the anode electrode and the cathode electrode. The light-emitting element may be implemented to emit light of the same color such as white light for each pixel or to emit light of a different color such as red, green, or blue for each pixel.

The encapsulation portion 130 may be disposed on the display substrate 110 so as to cover the pixel array 120.

The encapsulation portion 130 may prevent oxygen, moisture, or foreign material from invading the light-emitting layer of the pixel array 120. For example, the encapsulation portion 130 may be formed in a multi-layer structure in which an organic material layer and an inorganic material layer are alternately stacked. The present disclosure is not limited thereto.

The front portion FP of the display panel 100 may include the display substrate 110, the pixel array 120, and the encapsulation portion 130. The front portion may be formed in a flat manner except for an edge portion thereof.

The first back plate 210 to be described later may be connected or coupled to the back surface of the front portion FP so as to maintain the flat state of the front portion FP.

The bent portion BND of the display panel 100 may be free of the pixel array 120, the encapsulation portion 130, and the first back plate 210 to be described later, and may include the display substrate 110. The bent portion BND may be a portion that may be easily bent in a direction desired by the user.

The pad portion PAD of the display panel 100 may be free of the pixel array 120 and the encapsulation portion 130.

The second back plate 220 may be connected or coupled to a back surface of the pad portion PAD so that the pad portion PAD may be maintained in the flat state.

Therefore, the front portion FP of the display panel 100 may be disposed in the area in which the screen is displayed, and the pad portion PAD may be bent from the bent portion BND horizontally and inwardly and may be disposed below the front portion FP, that is, on the back surface of the front portion FP.

The first back plate 210 disposed under the front surface FP of the display panel 100 and the second back plate 220 disposed under the pad portion PAD may be disposed under the display substrate 110 so as to complement rigidity of the display substrate 110, and to maintain the front surface FP in the flat state.

Each of the first back plate 210 and the second back plate 220 may be formed to have a certain strength and thickness to complement the rigidity of the display substrate 110, and may not be formed in a bent portion area where the bent portion BND is located.

Based on a shape before the display panel 100 is bent, the first back plate 210 and the second back plate 220 may be disposed under the display substrate 110 and spaced apart from each other.

Based on a shape after the display panel 100 is bent, the first back plate 210 may be disposed under the front portion FP, and the second back plate 220 may be disposed on a top surface of the pad portion PAD.

Each of the first back plate 210 and the second back plate 220 may be a back plate disposed on the back surface of the display substrate 110.

Each of the first back plate 210 and the second back plate 220 may be composed of a plastic thin-film with rigidity.

For example, each of the first back plate 210 and the second back plate 220 may be made of polyethylene terephthalate (PET), polyimide (PI), polyethylene naphthalate (PEN), etc. The present disclosure is not limited thereto.

The first back plate 210 and the second back plate 220 may be made of the same material and may have the same thickness. The present disclosure is not limited thereto.

Based on the shape after the display panel 100 is bent, the cushion plate 300 may be disposed between the first back plate 210 and the second back plate 220.

The cushion plate 300 may be disposed under the first back plate 210.

The cushion plate 300 may include at least one of a heat-dissipation layer 310, a lift-off prevention layer 320, a cushion layer 330, and an adhesive layer 340. For example, the cushion plate 300 may have a structure in which the adhesive layer 340, the cushion layer 330, the lift-off prevention layer 320, and the heat-dissipation layer 310 are stacked downwardly sequentially.

The heat-dissipation layer 310 may be disposed in a corresponding manner to a component that generates a high temperature and may include a material with high thermal conductivity. Accordingly, a heat-dissipation effect of the display panel 100 may be improved.

The heat-dissipation layer 310 may be a conductive layer having conductivity.

Accordingly, the heat-dissipation layer 310 may have a grounding function and a function of protecting the back surface of the display substrate 110 together with the heat-dissipation function.

When the heat-dissipation layer 310 is made of a metal layer, the heat-dissipation layer 310 may effectively protect a distal end area of the display panel 100, which is vulnerable to cracks.

For example, the heat-dissipation layer 310 may include a metal having high thermal conductivity such as copper (Cu) and aluminum (Al), and graphite, or the like. The present disclosure is not limited thereto.

Further, the heat-dissipation layer 310 may include SUS (Stainless Use Steel), and may be embodied as a SUS plate.

When the heat-dissipation layer 310 includes the SUS, the heat-dissipation layer 310 may have higher thermal conductivity and strength while having a smaller thickness, compared to a case in which the heat-dissipation layer 310 includes other metals.

The lift-off prevention layer 320 may be disposed on the heat-dissipation layer 310.

The lift-off prevention layer 320 may be made of a flexible material such as polyimide. The present disclosure is not limited thereto.

When a side surface of the cover member 20 is bent, the cushion plate 300 may have a lifting phenomenon. For this reason, the lift-off prevention layer 320 may be disposed to prevent the lifting phenomenon.

Since the lift-off prevention layer 320 has flexibility, the lift-off prevention layer 320 may minimize the lifting phenomenon that may otherwise occur when the cover member 20 is curved.

The cushion layer 330 may be disposed on the lift-off prevention layer 320, and may include a foam tape or a foam pad.

The cushion layer 330 may reduce the impact to various parts that may come into contact with the cushion plate 300.

The cushion layer 330 with an impact reducing function may reinforce the rigidity of the cushion plate 300.

The adhesive layer 340 may be disposed on the cushion layer 330, and may include an unevenness structure formed on a surface of the adhesive layer 340.

The unevenness structure of the adhesive layer 340 may prevent air bubbles from being generated between the first back plate 210 and the cushion plate 300 when the cushion plate 300 is attached to the first back plate 210. Thus, a degassing or defoaming process for removing air bubbles between the first back plate 210 and the cushion plate 300 may be omitted.

The adhesive layer 340 includes an adhesive component, and is in direct contact with the first back plate 210 to fix the cushion plate 300 to the first back plate 210.

The adhesive layer 340 may be made of or include a material such as at least one of OCA (Optical Clear Adhesive), OCR (Optical Clear Resin), and PSA (Pressure Sensitive Adhesive).

The second connection member 400 and the second back plate 220 may be disposed under the cushion plate 300.

The second connection member 400 may be disposed between the cushion plate 300 and the pad portion PAD.

When the pad portion PAD of the display panel 100 is bent from the bent portion BND so as to be disposed under the front portion FP of the display panel 100, a restoring force to restore the display panel 100 to a state before being bent may be strong.

When the restoring force is strongly applied, a lifting phenomenon in which the bent pad portion PAD of the display panel 100 is not fixed and is lifted off may occur.

The second connection member 400 may function as a fixing member that fixes the bent display panel 100 so that the display panel 100 may maintain its bent shape.

The second connection member 400 may be formed to have a constant thickness in a thickness direction so as to maintain a constant curvature of the bent portion BND.

The second connection member 400 may be embodied as a double-sided tape having adhesive strength by which the second connection member 400 may fix the second back plate 220 and the heat-dissipation layer 310 to each other. The present disclosure is not limited thereto.

Alternatively, the second connection member 400 may be made of a foam tape or a foam pad having an adhesive force so as to further have an effect of mitigating the impact.

The second back plate 220 may be disposed under the second connection member 400.

To place the second back plate 220, the second back plate 220 may be attached to the bottom surface of the pad portion PAD, and then the bent portion BND may be bent, and the second back plate 220 may be attached and fixed to the bottom surface of the second connection member 400.

In a state in which the second back plate 220 is fixed to the second connection member 400, the second back plate 220 may be disposed on a top surface of the pad portion PAD.

For example, the second connection member 400 and the second back plate 220 may be disposed between the heat-dissipation layer 310 of the cushion plate 300 and the pad portion PAD.

While the second back plate 220 is fixed to the second connection member 400, an outer portion as a top surface of the bent portion BND may be exposed to the outside, while a bottom surface as an inner portion of the bent portion BND may face toward the side surfaces of the cushion plate 300 and the second connection member 400.

A reinforcing member 600 may be disposed on a top surface of the bent portion BND of the display panel 100.

The reinforcing member 600 may extend so as to cover the bent portion BND, and to cover at least a partial area of each of the front portion FP and the pad portion PAD.

The reinforcing member 600 may include resin. For example, the reinforcing member 600 may include UV-curable acrylic resin. The present disclosure is not limited thereto.

Since the reinforcing member 600 may cover various signal lines disposed between the encapsulation portion 130 and the pad portion PAD of the display panel 100, the reinforcing member 600 may prevent moisture from invading into the signal lines while protecting the signal line from the external impact.

In order to increase the flexibility of the display panel 100, the bent portion BND may be free of other components except for the display substrate 110 and the signal lines. Thus, the reinforcing member 600 may supplement the rigidity of the bent portion BND in which the other components are absent.

In one example, the driver circuit 160 may be disposed on the other surface to one surface of the pad portion PAD of the display panel 100 on which the second back plate 220 may be disposed.

The driver circuit 160 may be disposed in a form of a chip on plastic (COP) mounted on the display substrate 110. However, the present disclosure is not limited thereto.

The driver circuit 160 may generate a data signal and a gate control signal based on image data and a timing synchronization signal supplied from an external host driving system.

The driver circuit 160 may supply a data signal to the data line of each pixel via a display pad, and may supply a gate control signal to a gate driver circuit via the display pad.

The driver circuit 160 may be mounted in a chip mounting area defined in the display substrate 110, and may be electrically connected to the display pad, and may be connected to the signal lines of the gate driver circuit and the pixel array 120 disposed on the display substrate 110.

The display pad may be disposed at a distal end of the display substrate 110 on which the driver circuit 160 is mounted.

The display pad may be disposed on one surface of the display substrate 110 and electrically connected to the flexible circuit board 500 on which a circuit board is mounted.

The flexible circuit board 500 may be electrically connected to the display pad disposed on the distal end of the display substrate 110 via a film attachment process using a conductive adhesive layer, and may be positioned on the back surface of the display panel 100.

One example of a material of the conductive adhesive layer may include an anisotropic conductive film (ACF).

The circuit board may provide the image data and the timing synchronization signal supplied from the host driving system to the driver circuit 160, and may provide a voltage required to drive each of the pixel array 120 and the gate driver circuit and the driver circuit 160.

Hereinafter, with reference to FIG. 3, a display device according to another aspect of the present disclosure will be described.

FIG. 3 is a cross-sectional view in II-IF direction of the display device 10 according to an aspect of the present disclosure.

Each of the layers constituting the display device 10 shown in FIG. 3 may be shown to have a different thickness or size from that of each of the layers constituting the display device 10 shown in FIG. 2 for convenience of illustration. Descriptions of some of the layers may be omitted.

The display device 10 according to an aspect of the present disclosure may include the cover member 20, the display panel 100 disposed on one surface of the cover member 20, and the cushion plate 300 disposed on one surface of the display panel 100.

Referring to FIG. 3, the display panel 100 and the cushion plate 300 may be stacked sequentially on the cover member 20.

The first back plate 210 may be disposed between the display panel 100 and the cushion plate 300.

The cushion plate 300 includes the adhesive layer 340, the cushion layer 330, and the heat-dissipation layer 310. The adhesive layer 340, the cushion layer 330, and the heat-dissipation layer 310 may be stacked in this order on the display panel 100.

As used herein, surfaces of one layer facing each other may be defined as one surface and the other surface, respectively.

Accordingly, the heat-dissipation layer 310 may be disposed on one surface of the cushion layer 330, and the adhesive layer 340 may be formed on the other surface of the cushion layer 330.

Figure 4A:
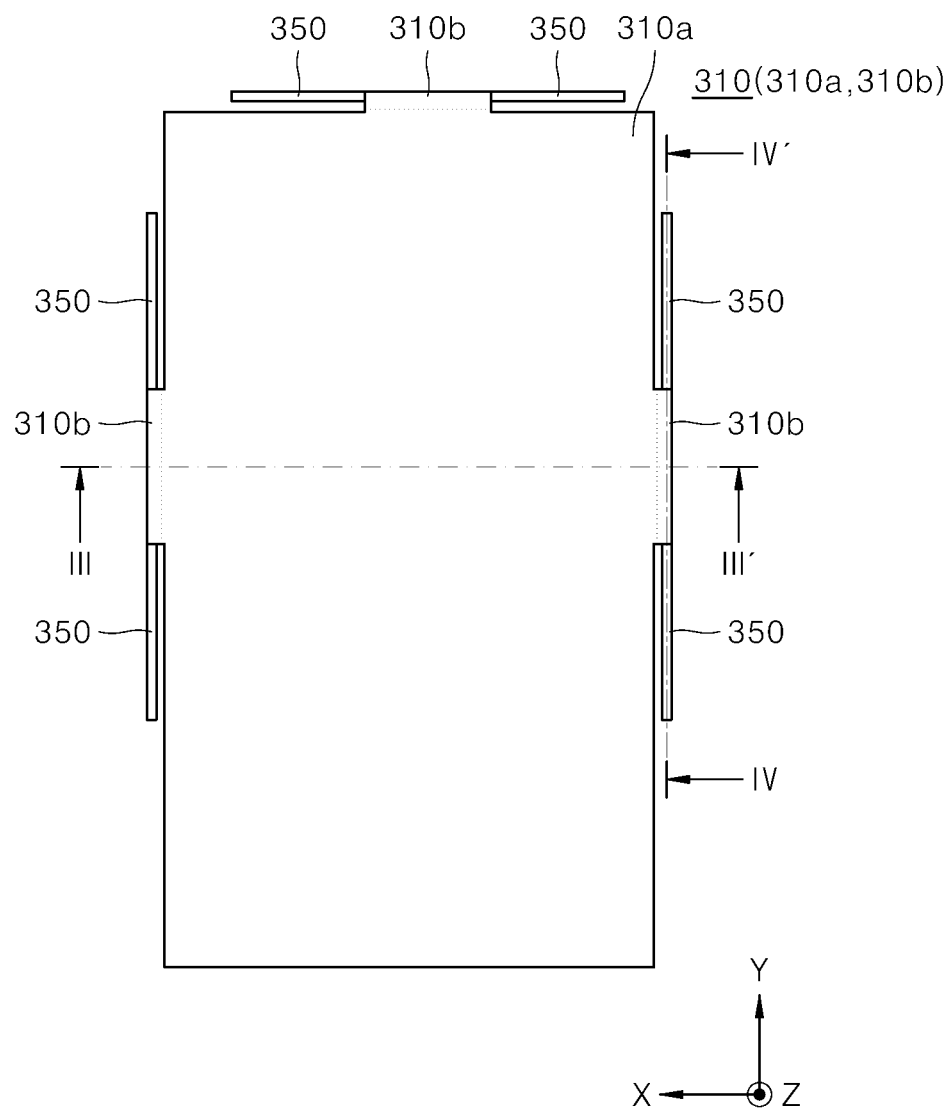
FIG. 4A to FIG. 4C are a plan view of a cushion plate, a cross-sectional view in direction, and a cross-sectional view in IV-IV' direction according to an aspect of the present disclosure, receptively.
Figure 4B:
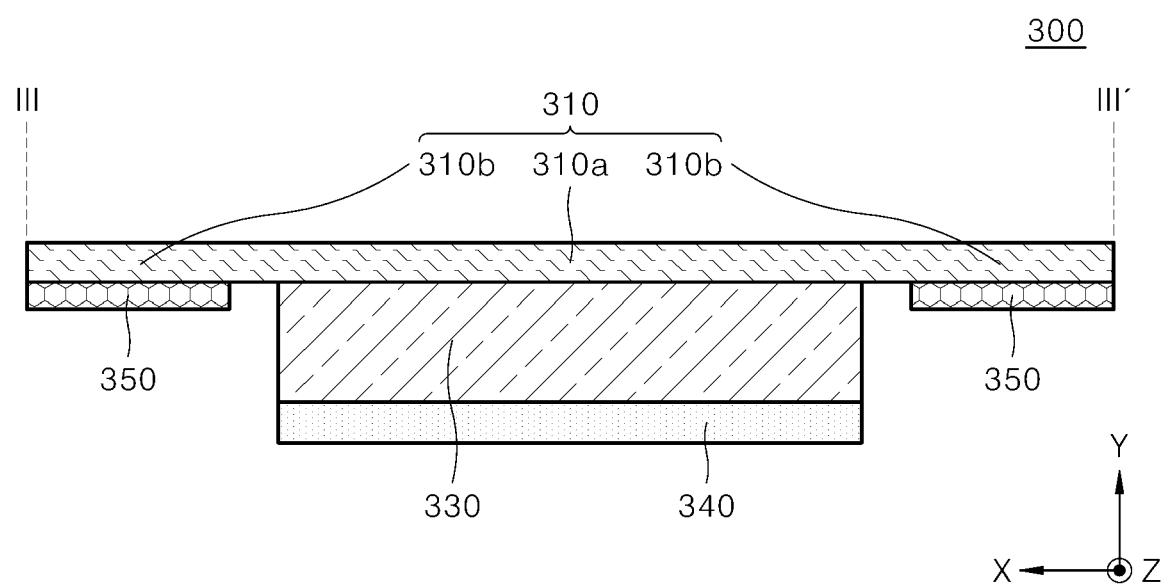
Figure 4C:
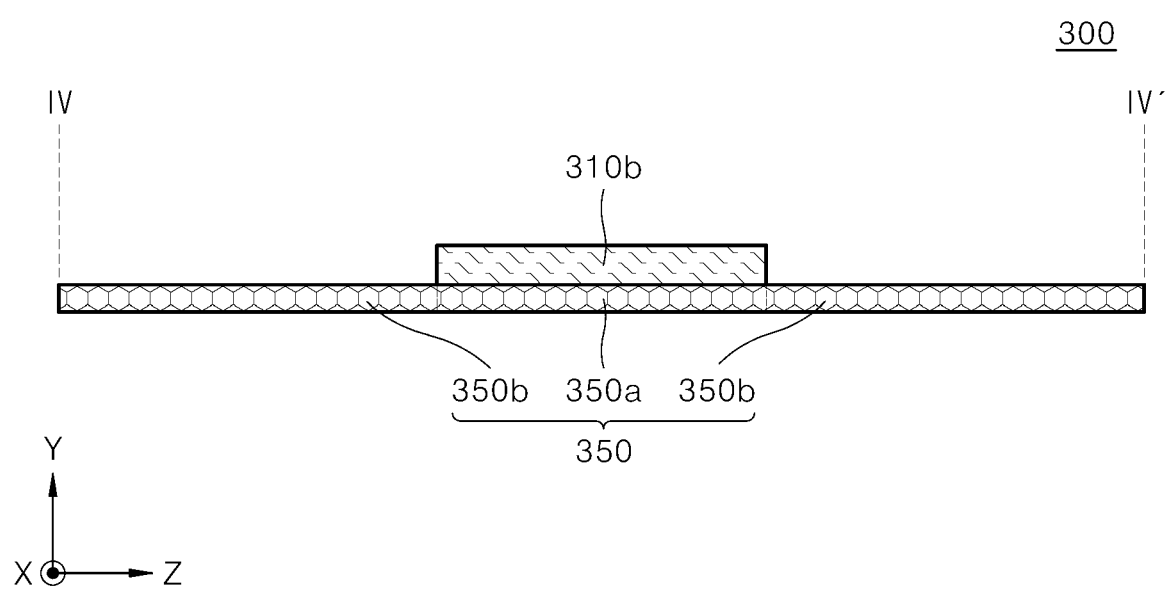

Referring to FIG. 4A to FIG. 4C, the cushion plate 300 according to an aspect of the present disclosure will be described.

The heat-dissipation layer 310 may include a first body 310a disposed to vertically overlap the cushion layer 330, and at least one first extension 310b extending outwardly of the cushion layer 330.

The first body 310a of the heat-dissipation layer 310 may have substantially the same shape as that of the cushion layer 330.

The first body 310a and the first extension 310b may not be physically separated from each other and may be integrally formed with each other.

In one example, the cushion plate 300 may be formed in a flat plate shape. The first body 310a of the heat-dissipation layer 310 may be formed in a flat plate shape.

When the first body 310a of the heat-dissipation layer 310 is formed in the flat plate shape, the first body 310a of the heat-dissipation layer 310 may have four side surfaces.

The first extension 310b may be formed to extend along at least one side surface of the first body 310a so as to protrude outwardly of the first body 310a and the cushion layer 330.

Referring to FIG. 4A, the first extension 310b is illustrated as being formed along three side surfaces of the first body 310a. However, the present disclosure is not limited thereto.

The first extension 310b may be formed to protrude outwardly and extend along a side surface of the first body 310a, and may be formed in an elongate bar shape along a length direction of the first body 310a.

Referring to FIG. 4B, a conductive adhesive layer 350 may be disposed on the other surface of the first extension 310b.

The other surface of the first extension 310b means a surface of the first extension 310b on which the cushion layer 330 is disposed.

Accordingly, the cushion layer 330 and the conductive adhesive layer 350 may be respectively disposed on the first body 310a and the other surface of the first extension 310b.

The cushion layer 330 and the conductive adhesive layer 350 may be disposed on the other surface of the heat-dissipation layer 310.

The lift-off prevention layer 320 may be disposed between the first body 310a and the cushion layer 330.

In this case, the lift-off prevention layer 320 and the conductive adhesive layer 350 may be disposed in the same layer and on the other surface of the heat-dissipation layer 310.

Referring to FIG. 4A and FIG. 4C, the conductive adhesive layer 350 may include a second body 350a disposed to vertically overlap the first extension 310b of the heat-dissipation layer 310, and a second extension 350b extending outwardly of the first extension 310b.

The second body 350a and the second extension 350b may not be physically separated from each other, and may be integrally formed with each other. That is, the second body 350a and the second extension 350b may be monolithic.

The second extension 350b of the conductive adhesive layer 350 may extend from the second body 350a along a length direction of the heat-dissipation layer 310 and may have an elongate bar shape.

Accordingly, the first extension 310b of the heat-dissipation layer 310 and the second extension 350b of the conductive adhesive layer 350 may extend in a direction perpendicular to each other.

Referring to FIG. 3, the heat-dissipation layer 310 of the cushion plate 300 includes the first extension 310b extending outwardly of the cushion layer 330. The first extension 310b may be disposed on one surface of the cover member 20 so as not to vertically overlap the display panel 100.

The display panel 100 and the cushion layer 330 are disposed between the first body 310a of the heat-dissipation layer 310 and the cover member 20, while the display panel 100 and the cushion layer 330 are not disposed between the first extension 310b of the heat-dissipation layer 310 and the cover member 20. Thus, the first body 310a and the first extension 310b may be disposed in different layers. Thus, a step may be formed therebetween.

Accordingly, the first extension 310b extending from the first body 310a may include an inclined portion in a step area.

The first extension 310b of the heat-dissipation layer 310 which is conductive may be disposed on one surface of the cover member 20, so that the first extension 310b may be electrically connected to the cover member 20.

Since the first extension 310b of the heat-dissipation layer 310 is electrically connected to the cover member 20, the electric charges of the cover member 20 may move to the cushion plate 300 through the charge movement path extending along the first extension 310b to the first body 310a of the heat-dissipation layer 310.

Therefore, according to an aspect of the present disclosure, the heat-dissipation layer 310 of the cushion plate 300 may extend outwardly of the cushion layer 330 so as to constitute a new charge movement path via which the cover member 20 and the cushion plate 300 are electrically connected to each other.

Accordingly, the concentration of the electric charges on the side surface of the display panel 100 may be reduced, thereby reducing the brighter phenomenon and the greenish phenomenon that may be otherwise intensively generated in a partial area of the side surface of the display panel 100.

Further, because the charge movement path via which the cover member 20 and the cushion plate 300 are electrically connected to each other is formed, and the display panel 100 may not constitute the charge movement path, an amount by which the electric charges of the cover member 20 do not move to a ground electrode via the cushion plate 300 but flow into the display panel 100 may be greatly reduced.

Further, because the heat-dissipation layer 310 extends outwardly and then is disposed on the cover member 20 so that the cushion plate 300 and the cover member 20 are directly connected to each other so as to constitute the charge movement path, a separate additional process for forming the charge movement path after forming the cushion plate 300, is not required, so that the efficiency of the manufacturing process may be improved.

The conductive adhesive layer 350 may be disposed between the first extension 310b of the heat-dissipation layer 310 and the cover member 20.

As the conductive adhesive layer 350 is disposed between the first extension 310b of the heat-dissipation layer 310 and the cover member 20, the electric charges of the cover member 20 may move to the back surface of the display device 10 through the charge movement path connected to the heat-dissipation layer 310 of the cushion plate 300 via the conductive adhesive layer 350.

Since the cushion plate 300 is electrically connected to the ground electrode, the electric charges moved to the back surface of the display device 10 may be discharged to the outside through the ground electrode.

As the conductive adhesive layer 350 is disposed between the first extension 310b of the heat-dissipation layer 310 and the cover member 20, adhesion between the cover member 20 and the first extension 310b may be improved, and thus, the occurrence of the lifting phenomenon may be reduced.

The conductive adhesive layer 350 may be embodied as a conductive tape. However, the present disclosure is not limited thereto.

In this way, the conductive adhesive layer 350 is formed between the heat-dissipation layer 310 of the cushion plate 300 and the cover member 20 so as to constitute the charge movement path. Thus, the conductive adhesive layer 350 may not be exposed to the outside, thereby reducing the loss of the charging function resulting from the damage to the charge movement path due to the external factors such as physical contact or impact.

Further, the conductive adhesive layer 350 is formed between the heat-dissipation layer 310 of the cushion plate 300 and the cover member 20 so as to constitute the charge movement path. Thus, stable resistance management may be achieved, and the charge movement path with the smallest width may be stably formed, compared to a case in which the charge movement path is formed using the charging solution.

For example, when the charge movement path is formed using the charging solution, the path may be formed to have a width of at least about 20 mm. When the conductive adhesive layer 350 is embodied as the conductive tape, the path may be formed to have a very small width of about 1 mm.

Further, when the charge movement path is formed using the charging solution, it is difficult to form the charging solution so as to have a constant thickness across an entirety of an area to which the solution is applied, and thus it is difficult to manage the path so as to have a uniform resistance over the entire area.

However, when forming the charge movement path using the conductive adhesive layer 350 instead of the charging solution as in an aspect of the present disclosure, the conductive adhesive layer 350 may be manufactured to have an uniform thickness, and thus the conductive adhesive layer 350 has a uniform resistance over the entire area.

The light blocking layer 21 may be disposed between the conductive adhesive layer 350 and the cover member 20.

In this case, the light blocking layer 21 may include a conductive material and thus have conductive properties.

When the light blocking layer 21 has the conductive properties, the electric charges of the cover member 20 may move to the first extension 310b of the heat-dissipation layer 310 of the cushion plate 300 via the conductive light blocking layer 21 and the conductive adhesive layer 350.

Accordingly, a new charge movement path including the light blocking layer 21 may be formed.

Hereinafter, a display apparatus according to an aspect of the present disclosure will be described with reference to FIGS. 5 to 9.

Figure 5:
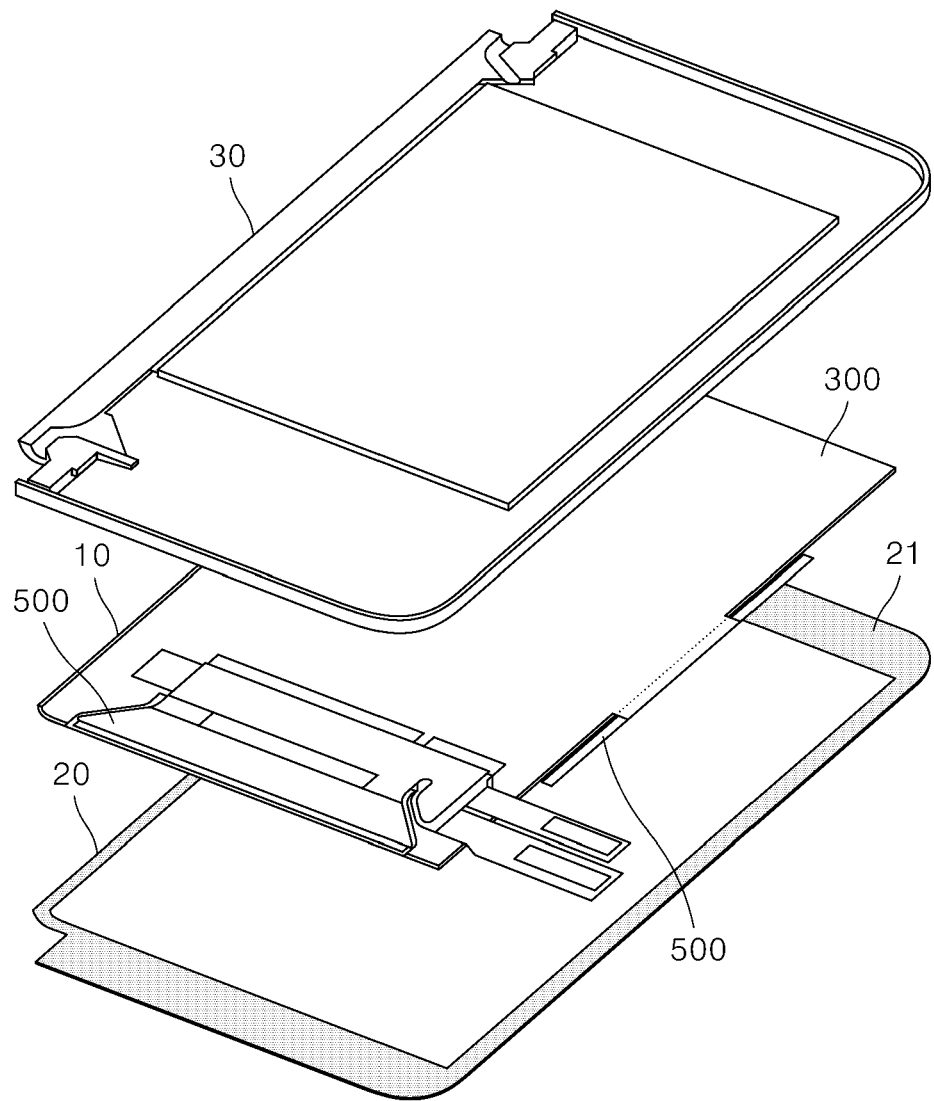
FIG. 5 is an exploded perspective view of a display apparatus including a cover member, a display device, and a middle frame according to an aspect of the present disclosure.

Referring to FIG. 5, the display apparatus 1 according to an aspect of the present disclosure may include the cover member 20, the display device 10, and a middle frame 30.

The casing 40 may be additionally disposed on the middle frame 30 so as to protect internal components of the display apparatus 1.

As used herein, each of the middle frame 30 and the casing 40 that are additionally disposed on the display device 10 may be defined as a set component.

Various additional components such as a battery and a storage device may be disposed in the set components, and an internal design of the set component may be modified in various forms based on an arrangement structure of the additional components.

Figure 6:
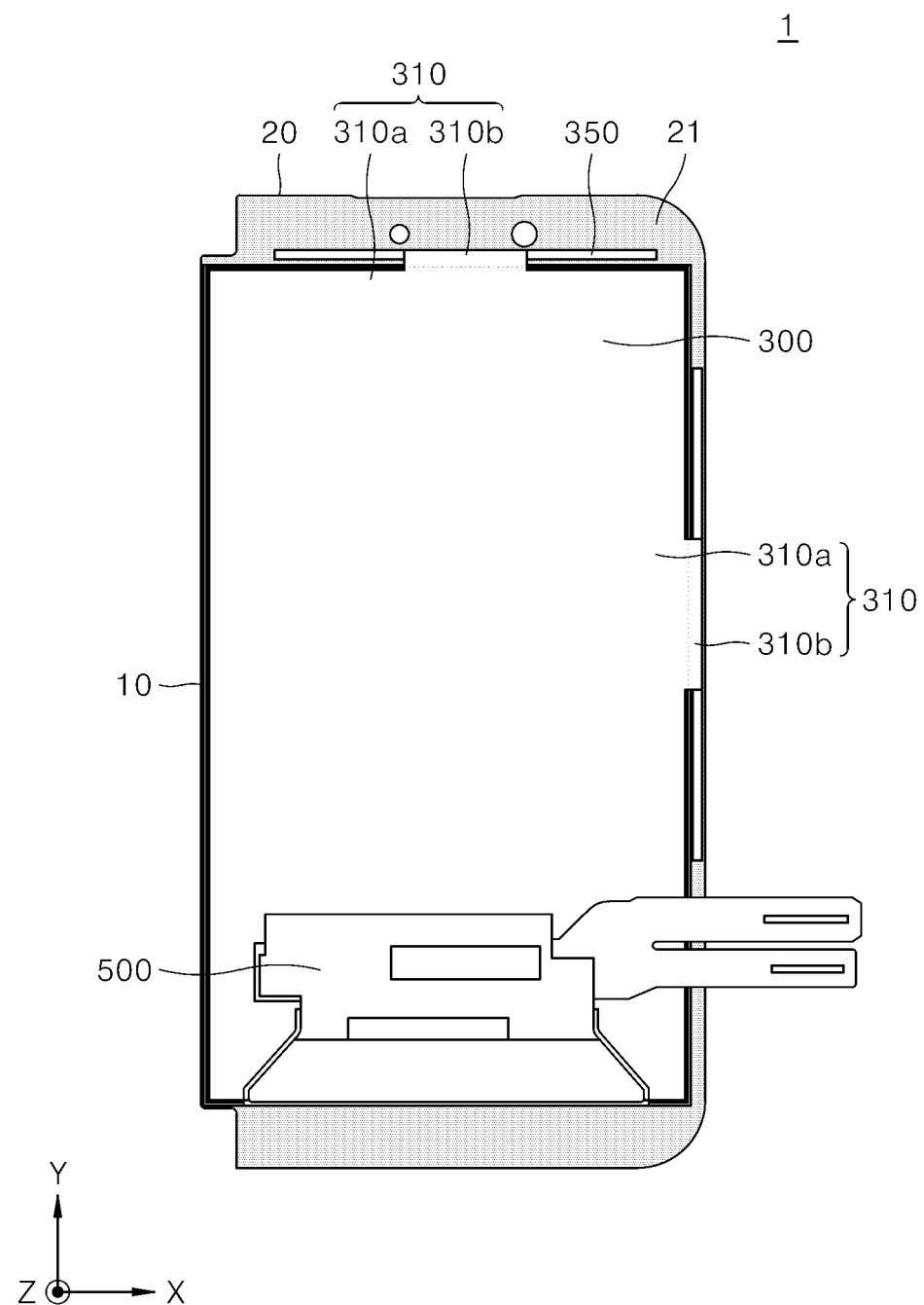
FIG. 6 is a back diagram of a display apparatus according to an aspect of the present disclosure.
Figure 7:
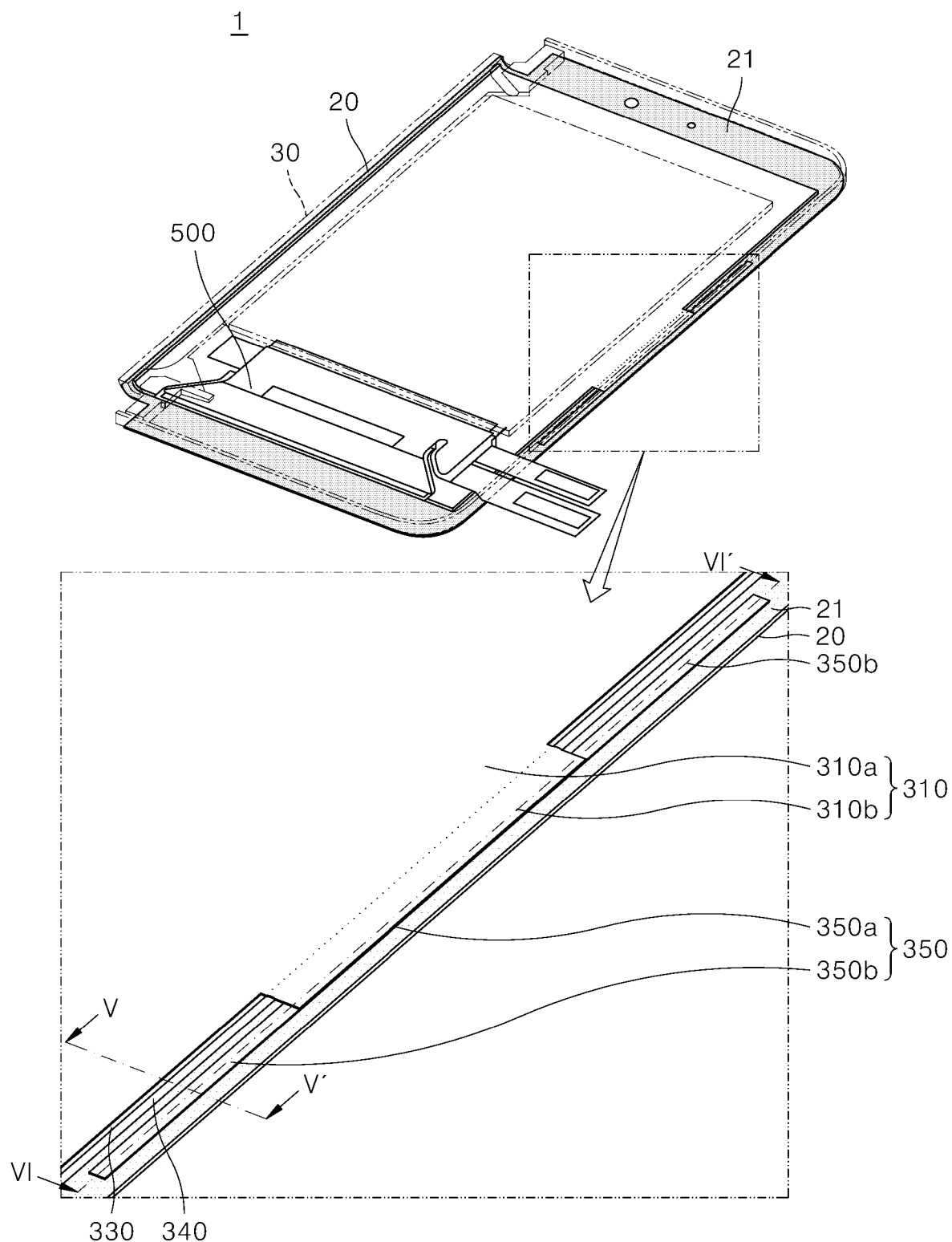
FIG. 7 is a perspective view of a display apparatus according to an aspect of the present disclosure and an enlarged view of a partial area of each of a cushion plate and a cover member thereof.

Referring to FIG. 6 and FIG. 7, when the display device 10 is coupled to the cover member 20, a second extension 350b of the conductive adhesive layer 350 may be formed to extend along an edge portion of the cover member 20.

Further, since the second extension 350b of the conductive adhesive layer 350 is formed to extend outwardly of the first extension 310b of the heat-dissipation layer 310, the second extension 350b may not vertically overlap with the cushion plate 300 so as to be exposed out of the cushion plate 300.

When the middle frame 30 is disposed on the display device 10, the middle frame 30 may be disposed on one surface of the cushion plate 300. The conductive adhesive layer 350 of the cushion plate 300 and the middle frame 30 may be electrically connected to each other.

Figure 8:
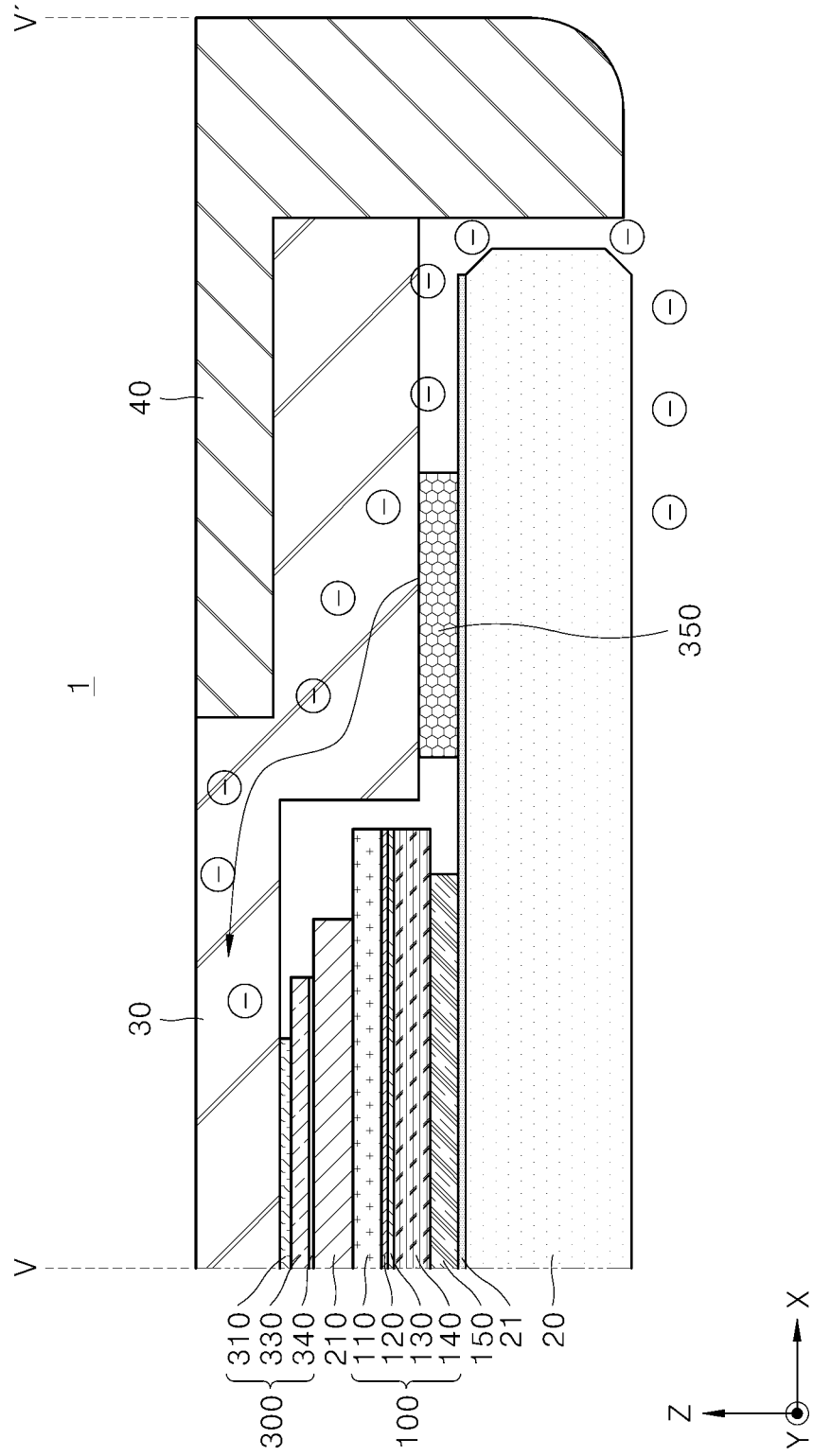
FIG. 8 is a cross-sectional view in V-V direction of a display apparatus according to an aspect of the present disclosure.
Figure 9:
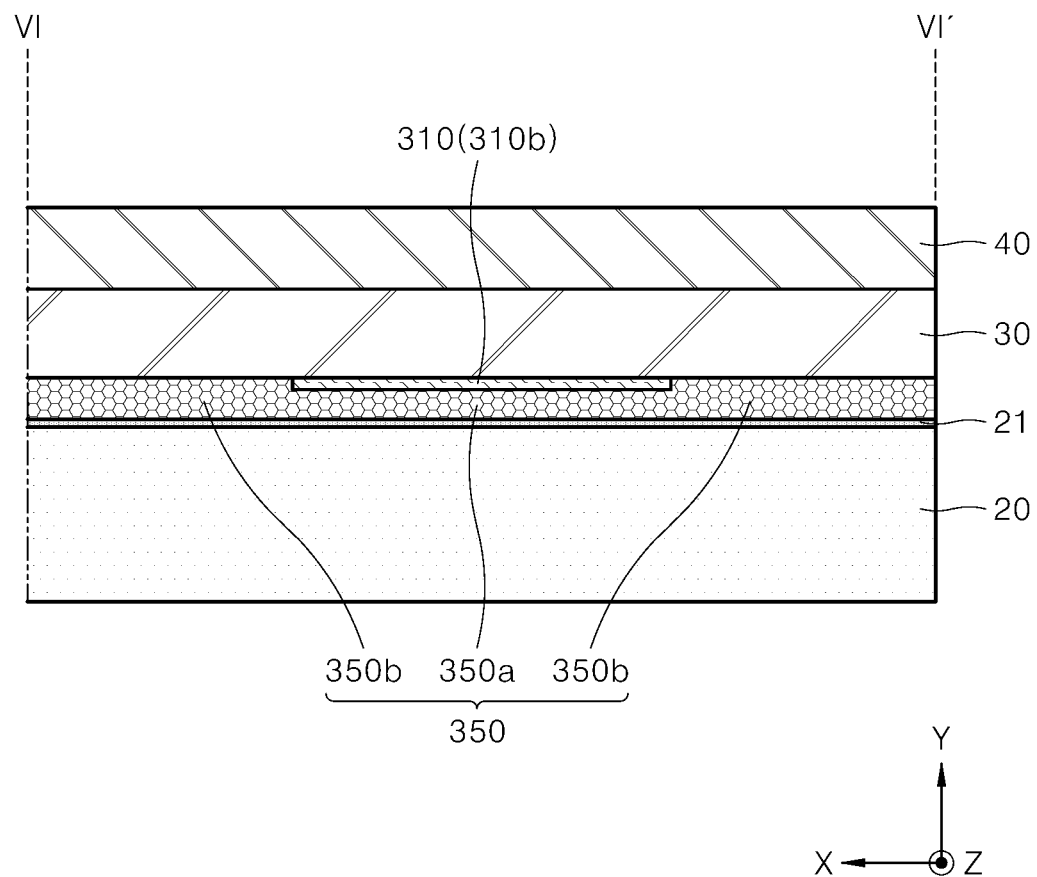
FIG. 9 is a cross-sectional view in VI-VI' direction of a display apparatus according to another aspect of the present disclosure.

Referring to FIG. 8 and FIG. 9, a portion of the middle frame 30 may be electrically connected to the second extension 350b of the conductive adhesive layer 350.

Since the second extension 350b of the conductive adhesive layer 350 does not vertically overlap with the first extension 310b of the heat-dissipation layer 310 and is exposed to the outside, a partial area of the middle frame 30 disposed on the cushion plate 300 may be in direct contact with and thus be electrically connected to the second extension 350b of the conductive adhesive layer 350.

Since the conductive adhesive layer 350 is electrically connected to the middle frame 30, the heat-dissipation layer 310 of the cushion plate 300 and the middle frame 30 may be electrically connected to each other via the conductive adhesive layer 350.

Therefore, a new charge movement path along which the electric charges of the cover member 20 may move directly to the middle frame 30 without passing through the heat-dissipation layer of the cushion plate 300 may be formed.

Further, a new charge movement path along which the electric charges of the cover member 20 may move to the cushion plate 300 via the middle frame 30 and the conductive adhesive layer 350 may be formed.

The portion of the middle frame 30 may be in direct contact with the first body 310a of the heat-dissipation layer 310 of the cushion plate 300.

Since the middle frame 30 may be fixed using the second extension 350b of the conductive adhesive layer 350, the first body 310a and the middle frame 30 may be fixed to and contact each other without separate fixing means between the first body 310a of the heat-dissipation layer 310 and the middle frame 30.

The portion of the middle frame 30 may be in direct contact with the first extension 310b of the heat-dissipation layer 310.

Referring to FIG. 9, the middle frame 30 may contact the first extension 310b and the second extension 350b at the same time.

For example, the conductive adhesive layer 350 may be embodied as an elastic conductive tape.

Therefore, when pressure is applied on the cushion plate 300 to bond the middle frame 30 thereto, the second body 350a of the conductive adhesive layer 350 vertically overlapping the first extension 310b of the heat-dissipation layer 310 is pressed by the middle frame 30 such that a thickness of the conductive adhesive layer 350 may be reduced.

Accordingly, the first extension 310b of the heat-dissipation layer 310 and the second extension 350b of the conductive adhesive layer 350 may be formed to be substantially coplanar with each other. Thus, the first extension 310b of the heat-dissipation layer 310 and the second extension 350b of the conductive adhesive layer 350 may contact the middle frame 30 at the same time.

Further, the middle frame 30 may have a step such that the middle frame 30 may be in contact with the first extension 310b of the heat-dissipation layer 310, the second extension 350b of the conductive adhesive layer 350, and the first body 310a of the cushion plate 300 at the same time.

Therefore, the middle frame 30 may be electrically connected to the cover member 20 and the display device 10 connected to the cushion plate 300 at the same time, and thus may discharge the electric charges to the ground electrode.

Further, as a contact area in which the middle frame 30 is in direct contact with the heat-dissipation layer 310 and the conductive adhesive layer 350 of the cushion plate 300 increases, the charge movement path composed of the cover member 20, the middle frame 30, and the cushion plate 300 may be formed and maintained robustly and stably.

Further, according to an aspect of the present disclosure, an overall thickness of the display apparatus 1 may be reduced.

Figure 10:
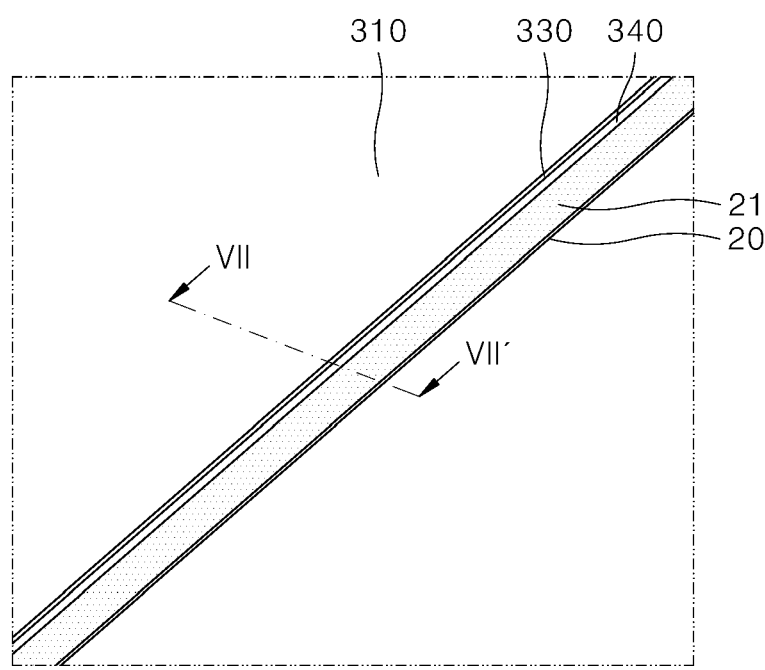
FIG. 10 is an enlarged view of a partial area of each of a cushion plate and a cover member of a display apparatus according to another aspect of the present disclosure.
Figure 11:
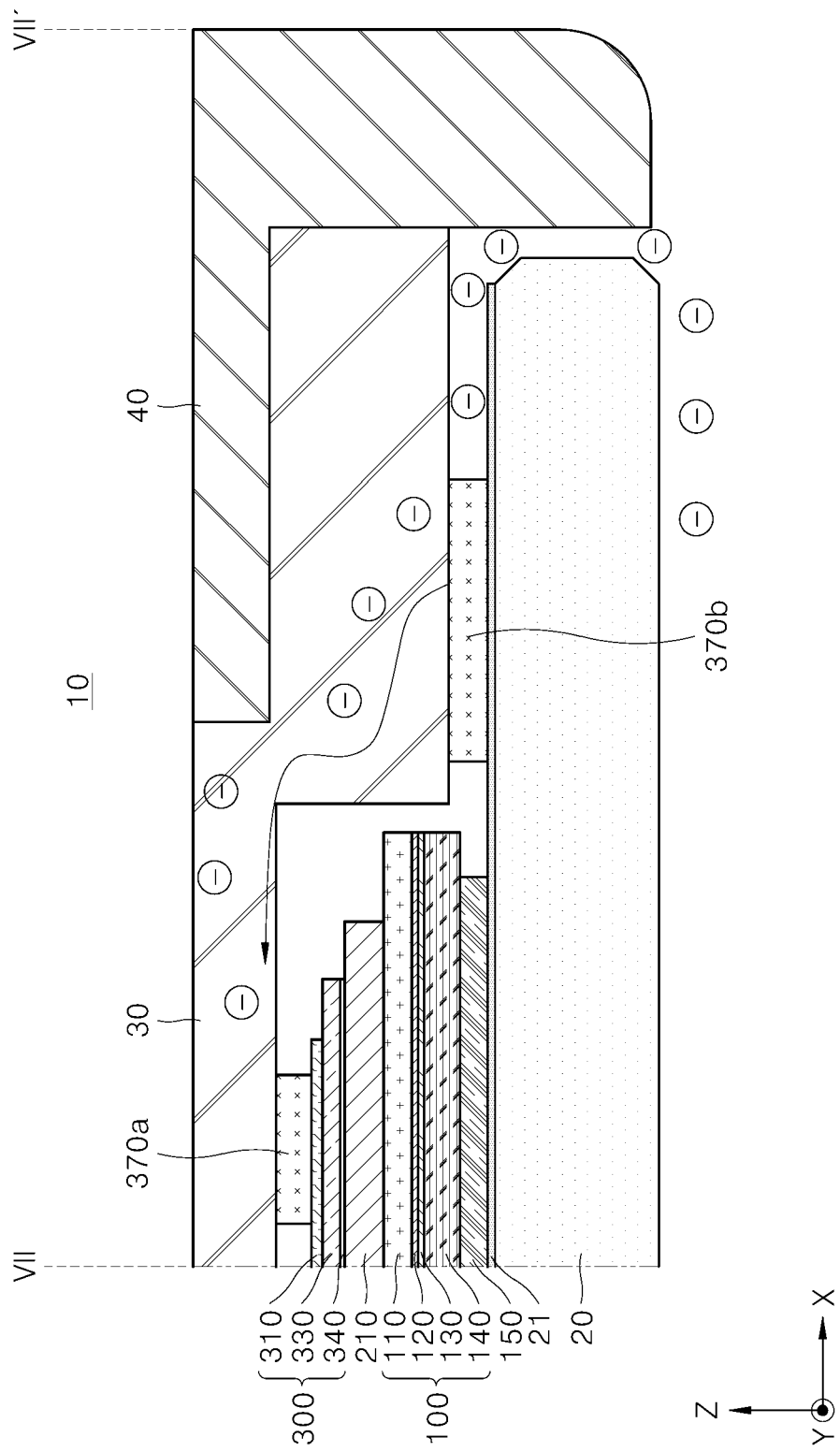
FIG. 11 is a cross-sectional view in VII-VII' direction of a display apparatus according to an aspect of the present disclosure.

Referring to FIG. 10 and FIG. 11, in another aspect of the present disclosure, the first extension as an outwardly extension of the heat-dissipation layer 310 of the cushion plate 300 may not be formed.

However, in this case, a separate set adhesive tape such as a first set adhesive tape 370a may be required for securing the electrical connection between the middle frame 30 and the heat-dissipation layer 310 of the cushion plate 300 and for fixing the frame 30 and the heat-dissipation layer 310 to each other.

Further, a separate set adhesive tape such as a second set adhesive tape 370b may be required for securing the electrical connection between the middle frame 30 and the cover member 20 and for fixing the frame 30 and the cover member 20 to each other.

Therefore, the thickness of the display apparatus 1 may be increased by a thickness of the separate set adhesive tape added to between the middle frame 30 and the heat-dissipation layer 310 of the cushion plate 300.

However, according to an aspect of the present disclosure referring to FIG. 8, the heat-dissipation layer 310 of the cushion plate 300 and the middle frame 30 may be electrically connected to each other via the conductive adhesive layer 350. Thus, there is no need to provide a separate set adhesive tape to form the charge movement path between the cushion plate 300 and the middle frame 30.

Accordingly, according to an aspect of the present disclosure, the overall thickness of the display apparatus 1 may be reduced as much as the thickness of the set adhesive tape is reduced.

A first aspect of the present disclosure provides a display device comprising: a cover member; a display panel disposed on one surface of the cover member; and a cushion plate disposed on one surface of the display panel, wherein the cushion plate includes a cushion layer and a heat-dissipation layer, wherein the heat-dissipation layer includes: a first body vertically overlapping the cushion layer; and at least one first extension extending from the first body and outwardly of the cushion layer so as not to vertically overlap the cushion layer, wherein the first extension is disposed on one surface of the cover member so as not to vertically overlap with the display panel.

In one implementation of the display device, the first extension extends along at least one side surface of the first body.

In one implementation of the display device, the first extension is electrically connected to the cover member.

In one implementation of the display device, the display device further comprises a conductive adhesive layer between the first extension and the cover member.

In one implementation of the display device, the conductive adhesive layer includes: a second body disposed to vertically overlap the first extension; and a second extension extending from the second body and outwardly of the first extension so as not to vertically overlap the first extension.

In one implementation of the display device, the second extension extends along an edge portion of the cover member.

In one implementation of the display device, the second extension is disposed so as not to vertically overlap the cushion plate.

In one implementation of the display device, the display device further comprises a conductive light blocking layer disposed between the conductive adhesive layer and the cover member.

A second aspect of the present disclosure provides a display apparatus comprising: a cover member; a display panel disposed on one surface of the cover member; a cushion plate disposed on one surface of the display panel, wherein the cushion plate includes a cushion layer, and a heat-dissipation layer, wherein the heat-dissipation layer includes a first body and a first extension extending from the first body and outwardly of the cushion layer so as not to vertically overlap the cushion layer; a conductive adhesive layer disposed between the first extension and the cover member, wherein the conductive adhesive layer includes a second body and a second extension extending from the second body and outwardly of the first extension so as not to vertically overlap the first extension; and a middle frame disposed on one surface of the cushion plate and electrically connected to the conductive adhesive layer.

In one implementation of the display apparatus, the second extension is exposed out of the cushion plate.

In one implementation of the display apparatus, the first extension and the second extension extend in a perpendicular manner to each other.

In one implementation of the display apparatus, a portion of the middle frame is in contact with the second extension.

In one implementation of the display apparatus, a portion of the middle frame is in contact with the first extension.

In one implementation of the display apparatus, a portion of the middle frame is in contact with the first body.

A third aspect of the present disclosure provides a cushion plate comprising: a heat-dissipation layer; a cushion layer disposed on one surface of the heat-dissipation layer; and a conductive adhesive layer disposed on one surface of the heat dissipation layer, wherein the heat-dissipation layer includes a first extension extending outwardly of the cushion layer and the conductive adhesive layer is disposed to overlap the first extension.

In one implementation of the cushion plate, the cushion layer and the conductive adhesive layer are disposed on the same layer based on the heat-dissipation layer.

In one implementation of the cushion plate, the conductive adhesive layer includes a second extension extending outwardly of the first extension.

In one implementation of the cushion plate, the second extension extends along a length direction of the heat-dissipation layer.

In one implementation of the cushion plate, the cushion plate further comprising an adhesive layer disposed on the opposite surface of the cushion layer on which the heat-dissipation layer is disposed.

Although the aspects of the present disclosure have been described above in more detail with reference to the accompanying drawings, the present disclosure is not necessarily limited to the aspects, and various modifications may be made within the scope that does not deviate from the technical spirit of the present disclosure. Therefore, the aspects as disclosed in the present disclosure are to illustrate the disclosure rather than limiting the technical idea of the present disclosure, and the scope of the technical idea of the present disclosure is not limited to the aspects. Therefore, it should be understood that the aspects as described above are illustrative in all respects and not restrictive. The protective scope of the present disclosure should be interpreted based on the claims, and all technical ideas within the scope equivalent thereto should be construed as being included in the scope of the present disclosure.

What is claimed is:

1. A display device comprising:
    a cover member;
    a display panel disposed under the cover member; and
    a cushion plate disposed under the display panel and including a cushion layer and a heat-dissipation layer,
    wherein the heat-dissipation layer includes:
    a first body vertically overlapping the cushion layer; and
    at least one first extension extending from the first body and outwardly of the cushion layer, and
    wherein the at least one first extension is disposed on the cover member so as not to vertically overlap with the display panel.

2. The display device of claim 1, wherein the at least one first extension extends along at least one side surface of the first body.

3. The display device of claim 1, wherein the at least one first extension is electrically connected to the cover member.

4. The display device of claim 1, further comprising a conductive adhesive layer between the at least one first extension and the cover member.

5. The display device of claim 4, wherein the conductive adhesive layer includes:
    a second body vertically overlapping with the first extension; and
    a second extension extending from the second body and outwardly of the at least one first extension so as not to vertically overlap with the at least one first extension.

6. The display device of claim 5, wherein the second extension extends along an edge portion of the cover member.

7. The display device of claim 5, wherein the second extension is disposed so as not to vertically overlap with the cushion plate.

8. The display device of claim 4, further comprising a conductive light blocking layer disposed between the conductive adhesive layer and the cover member.

9. The display device of claim 1, the heat-dissipation layer is a conductive layer having conductivity.

10. A display apparatus comprising:
    a cover member;
    a display panel disposed under the cover member;
    a cushion plate disposed under the display panel and including a cushion layer, and a heat-dissipation layer, wherein the heat-dissipation layer includes a first body and a first extension extending from the first body and outwardly of the cushion layer so as not to vertically overlap with the cushion layer;
    a conductive adhesive layer disposed between the first extension and the cover member and including a second body and a second extension extending from the second body and outwardly of the first extension so as not to vertically overlap with the first extension; and
    a middle frame disposed on one surface of the cushion plate and electrically connected to the conductive adhesive layer.

11. The display apparatus of claim 10, wherein the second extension is exposed out of the cushion plate.

12. The display apparatus of claim 10, wherein the first extension and the second extension extend in a perpendicular manner.

13. The display apparatus of claim 10, wherein a portion of the middle frame is in contact with the second extension.

14. The display apparatus of claim 10, wherein a portion of the middle frame is in contact with the first extension.

15. The display apparatus of claim 10, wherein a portion of the middle frame is in contact with the first body.

16. A cushion plate comprising:
    a heat-dissipation layer;
    a cushion layer disposed on the heat-dissipation layer; and
    a conductive adhesive layer disposed on the heat dissipation layer,
    wherein the heat-dissipation layer includes a first extension extending outwardly of the cushion layer and the conductive adhesive layer is disposed to overlap with the first extension.

17. The cushion plate of claim 16, wherein the cushion layer and the conductive adhesive layer are disposed on a same layer with respect to the heat-dissipation layer.

18. The cushion plate of claim 16, wherein the conductive adhesive layer includes a second extension extending outwardly of the first extension.

19. The cushion plate of claim 18, wherein the second extension extends along a length direction of the heat-dissipation layer.

20. The cushion plate of claim 16, further comprising an adhesive layer disposed on the opposite surface of the cushion layer on which the heat-dissipation layer is disposed.

21. The display device of claim 1, wherein the display panel includes:
    a flexible display substrate including a bent portion in a non-display area;
    a pixel array disposed on the flexible display substrate;
    an encapsulation portion disposed to cover an upper surface and side surfaces of the pixel array;
    a polarizing plate disposed on the encapsulation portion;
    a reinforcing member disposed on the bent portion; and
    a fixing member disposed on a portion of the polarizing plate and the reinforcing member.

22. The display device of claim 21, wherein the polarizing plate and a portion of the reinforcing member are located on the same layer.

23. The display device of claim 21, wherein one side of the polarizing plate and one side of a portion of the reinforcing member are in contact with each other.

* * * * *